(12) United States Patent
Hamano et al.

(10) Patent No.: US 7,878,562 B2
(45) Date of Patent: Feb. 1, 2011

(54) SEMICONDUCTOR WAFER CARRIER BLADE

(75) Inventors: Manabu Hamano, Utsunomiya (JP); John A. Pitney, St. Peters, MO (US); Lance G. Hellwig, St. Louis, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 518 days.

(21) Appl. No.: 11/967,694

(22) Filed: Dec. 31, 2007

(65) Prior Publication Data

US 2009/0169346 A1 Jul. 2, 2009

(51) Int. Cl.
*B65G 49/07* (2006.01)
(52) U.S. Cl. .................... 294/1.1; 294/902; 414/941
(58) Field of Classification Search .............. 294/1.1, 294/902; 414/935–941
See application file for complete search history.

(56) References Cited

U.S. PATENT DOCUMENTS

| | | | |
|---|---|---|---|
| 5,061,144 A | * | 10/1991 | Akimoto et al. ......... 414/222.02 |
| 5,622,400 A | | 4/1997 | George |
| 5,669,644 A | * | 9/1997 | Kaihotsu et al. ............. 294/1.1 |
| 5,746,460 A | | 5/1998 | Marohl et al. |
| 5,889,644 A | | 3/1999 | Schoenfeld et al. |
| 5,980,194 A | | 11/1999 | Freerks et al. |
| 6,062,241 A | * | 5/2000 | Tateyama et al. ........... 134/137 |
| 6,260,894 B1 | | 7/2001 | Minnick et al. |
| 6,860,533 B2 | * | 3/2005 | Lee et al. ................... 294/64.1 |
| 6,976,822 B2 | * | 12/2005 | Woodruff et al. ......... 414/744.5 |
| 7,048,316 B1 | * | 5/2006 | Blank et al. .................. 294/1.1 |
| 7,100,954 B2 | | 9/2006 | Klein et al. |
| 2004/0150237 A1 | * | 8/2004 | Casarotti et al. ........... 294/64.1 |
| 2005/0036855 A1 | | 2/2005 | Garcia, Jr. |

FOREIGN PATENT DOCUMENTS

WO  2003009346 A2  1/2003

* cited by examiner

*Primary Examiner*—Dean J Kramer
(74) *Attorney, Agent, or Firm*—Armstrong Teasdale LLP

(57) ABSTRACT

A carrier blade for transferring a semiconductor wafers into and out of a deposition chamber may include transition surfaces sloping downward from ledge surfaces. The transition surfaces slope from the corresponding ledges at angles that are greater than about 90 degrees so that the edges between the ledge surfaces and the transition surfaces are not sharp. The carrier blade may include bevels extending from the ledge surface(s) to upper lateral edges of the carrier blade.

21 Claims, 8 Drawing Sheets

SEMICONDUCTOR WAFER CARRIER BLADE

FIELD OF THE INVENTION

The present invention generally relates to a carrier blade for transferring a semiconductor wafer into and out of a deposition chamber.

BACKGROUND

A semiconductor wafer may be subjected to a chemical vapor deposition process such as an epitaxial deposition process to grow a thin layer of silicon on the front surface of the wafer. This process allows devices to be fabricated directly on a high quality epitaxial layer. Conventional epitaxial deposition processes are disclosed in U.S. Pat. Nos. 5,904,769 and 5,769,942, which are incorporated herein by reference.

The semiconductor wafer is transferred to (i.e., loaded) and removed from (i.e., unloaded) a deposition chamber using a quartz carrier blade. A conventional quartz carrier blade has spaced, arcuate ledge surfaces that are recessed below a top surface of the blade. The ledge surfaces have descending sides that fall off perpendicular to the ledge surface resulting in sharp edges. These "sharp" edges underlie the back side of the support semiconductor wafer.

The loading temperature of the deposition chamber is about 700° C. and the unloading temperature is about 800° C. The wafer and the carrier blade are at a lower temperature when the wafer is loaded into the relatively hot deposition chamber. As a result of this temperature difference, the wafer experiences thermal shock as it enters the deposition chamber. The wafer also experiences thermal shock when the carrier blade unloads the wafer from the chamber because the blade is at about room temperature and the wafer is at about 800° C. The wafer tends to bow downwards during the thermal shock, and the sharp edges of the blade between the ledge surfaces and the sides cause scratches and other damage to the back side of the bowing wafer.

SUMMARY

In one aspect, a carrier blade for transferring a semiconductor wafer into and out of a deposition chamber has top and bottom surfaces and a longitudinal axis extending between opposite mounting and free ends. The carrier blade generally comprises a support region for supporting a semiconductor wafer. The support region has mounting and free end margins spaced from one another along the longitudinal axis and a lower surface extending between the mounting and free end margins. An engagement portion at the support region includes a ledge surface at each of the mounting and free end margins of the support region for engaging and supporting the wafer. The ledge surfaces lie generally in a support plane disposed below the top surface of the blade. Transition surfaces slope downward from the ledge surfaces toward the lower surface of the support region. Each of the transition surfaces slope downward from the corresponding ledge surface at an angle measuring greater than 90 degrees.

In another aspect, a carrier blade for transferring a semiconductor wafer into and out of a support rack has top and bottom surfaces, a longitudinal axis extending between opposite mounting and free ends of the body, and an upper lateral edge on either side of the longitudinal axis extending along a length of the blade. The carrier blade generally comprises a support region for supporting a semiconductor wafer. The support region has mounting and free end margins spaced from one another along the longitudinal axis of the carrier blade and a lower surface extending between the mounting and free end margins. An engagement portion at the support region includes ledge surfaces at the respective mounting and free end margins of the support region for engaging and supporting the wafer. The ledge surfaces lie generally in a support plane positioned below the top surface of the carrier blade. A pair of bevels is at one of the mounting and free end margins of the support region. Each bevel is disposed on opposite sides of the longitudinal axis and extends from the corresponding ledge surface of the respective one of the mounting and free end margins to the corresponding one of the upper lateral edges of the carrier blade.

In yet another aspect, a carrier blade for transferring a semiconductor wafer into and out of a support rack has top and bottom surfaces and a longitudinal axis extending between mounting and free ends. The carrier blade generally comprises a support region for supporting a semiconductor wafer. The support region has mounting and free end margins spaced from one another along the longitudinal axis of the blade and a lower surface extending between the mounting and free end margins. An engagement portion at the support region includes ledge surfaces at the respective mounting and free end margins of the support region for engaging and supporting a back side of the wafer. The ledge surfaces lie generally in a support plane disposed below the top surface of the blade. The ledge surfaces are free from descending edges that are sharp so that when the wafer is being supported by the engagement portion it is not in contact with any sharp edges, thereby reducing back side damage to the wafer.

Other objects and features will be in part apparent and in part pointed out hereinafter.

BRIEF DESCRIPTION OF THE DRAWINGS

Corresponding reference characters indicate corresponding parts throughout the drawings.

DESCRIPTION OF THE PREFERRED EMBODIMENTS

Figure 1:
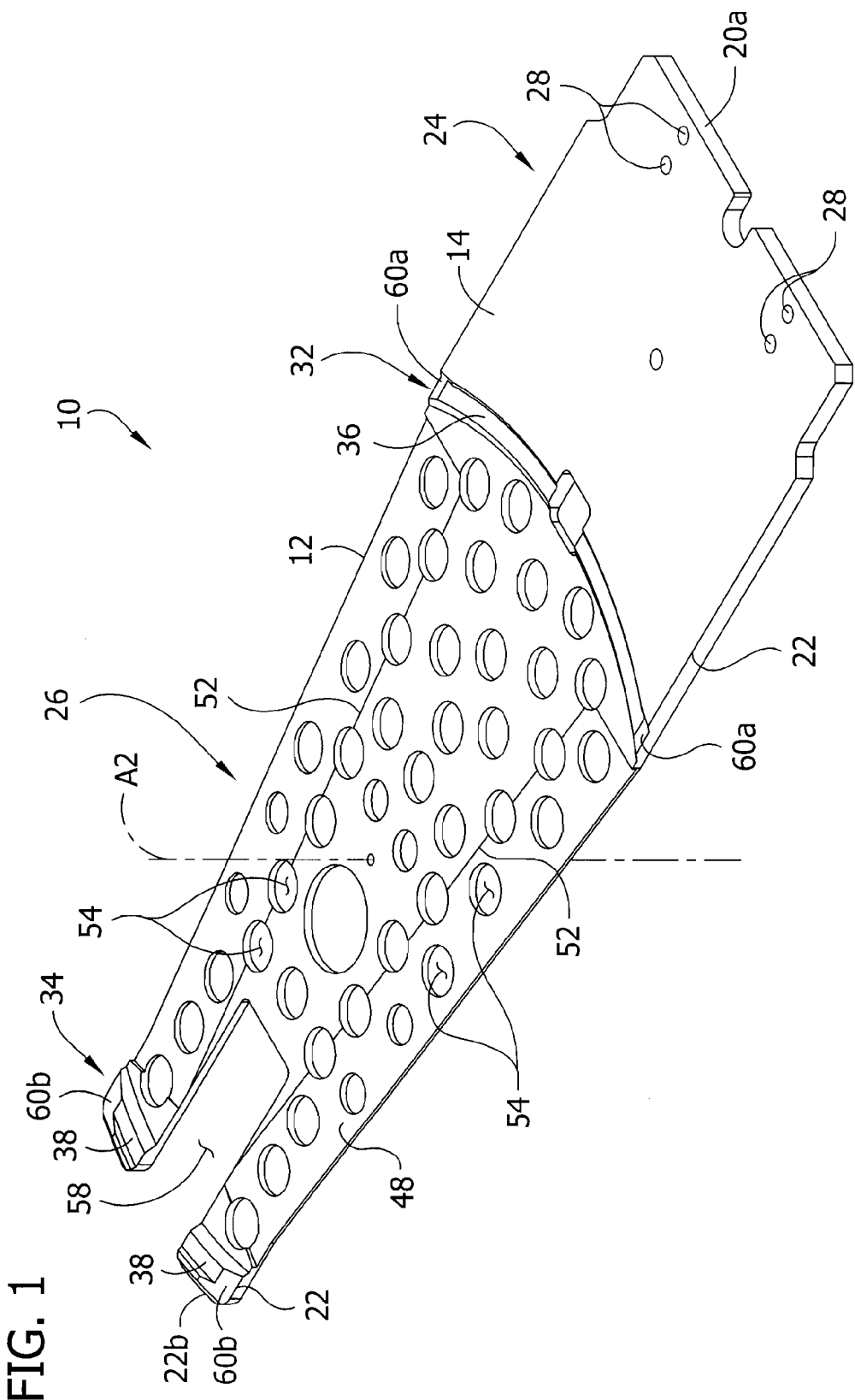
FIG. 1 is a perspective of one embodiment of a blade carrier for transferring a semiconductor wafer into and out of a support rack.
Figure 2:
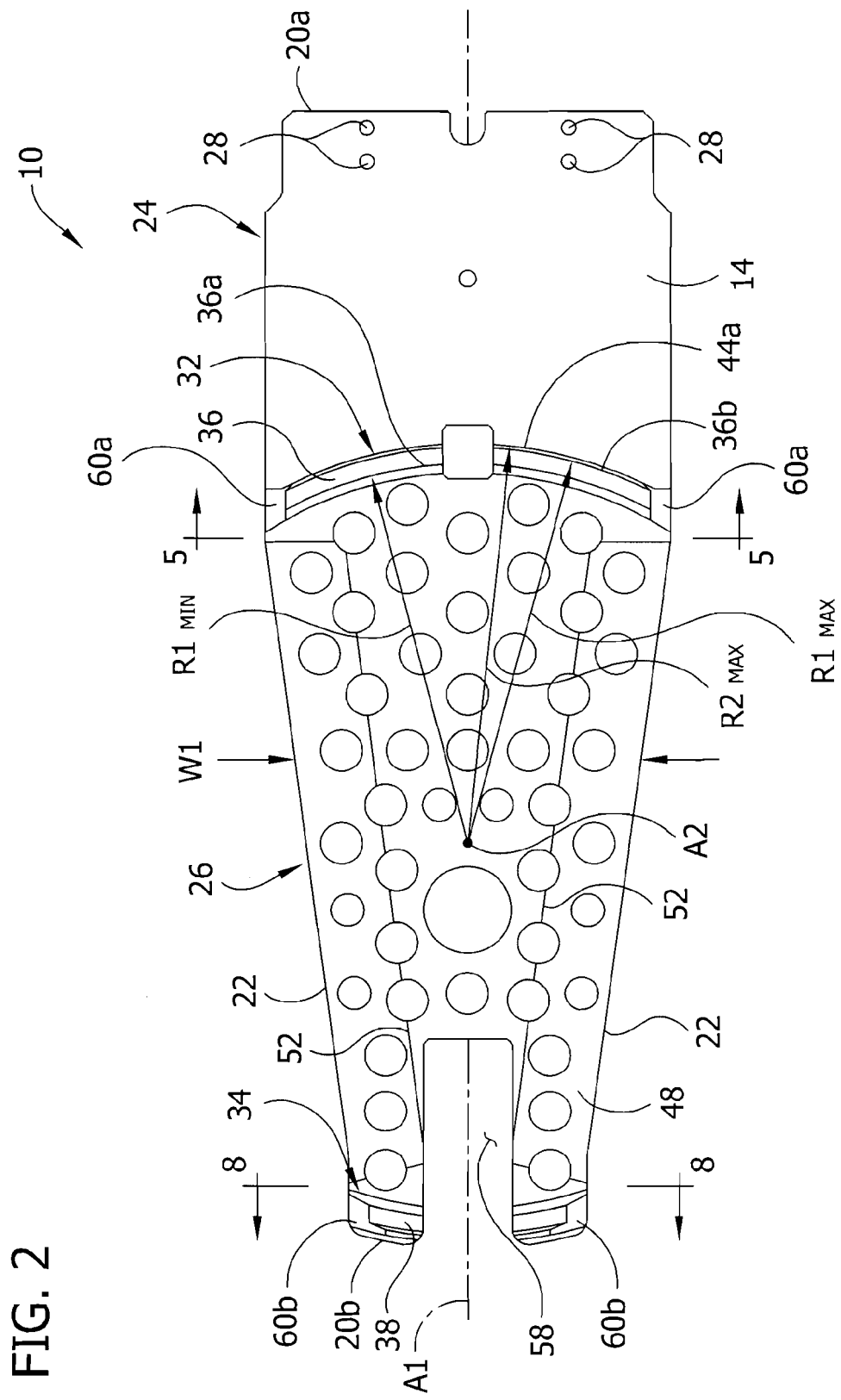
FIG. 2 is a top plan of the blade carrier.
Figure 4:
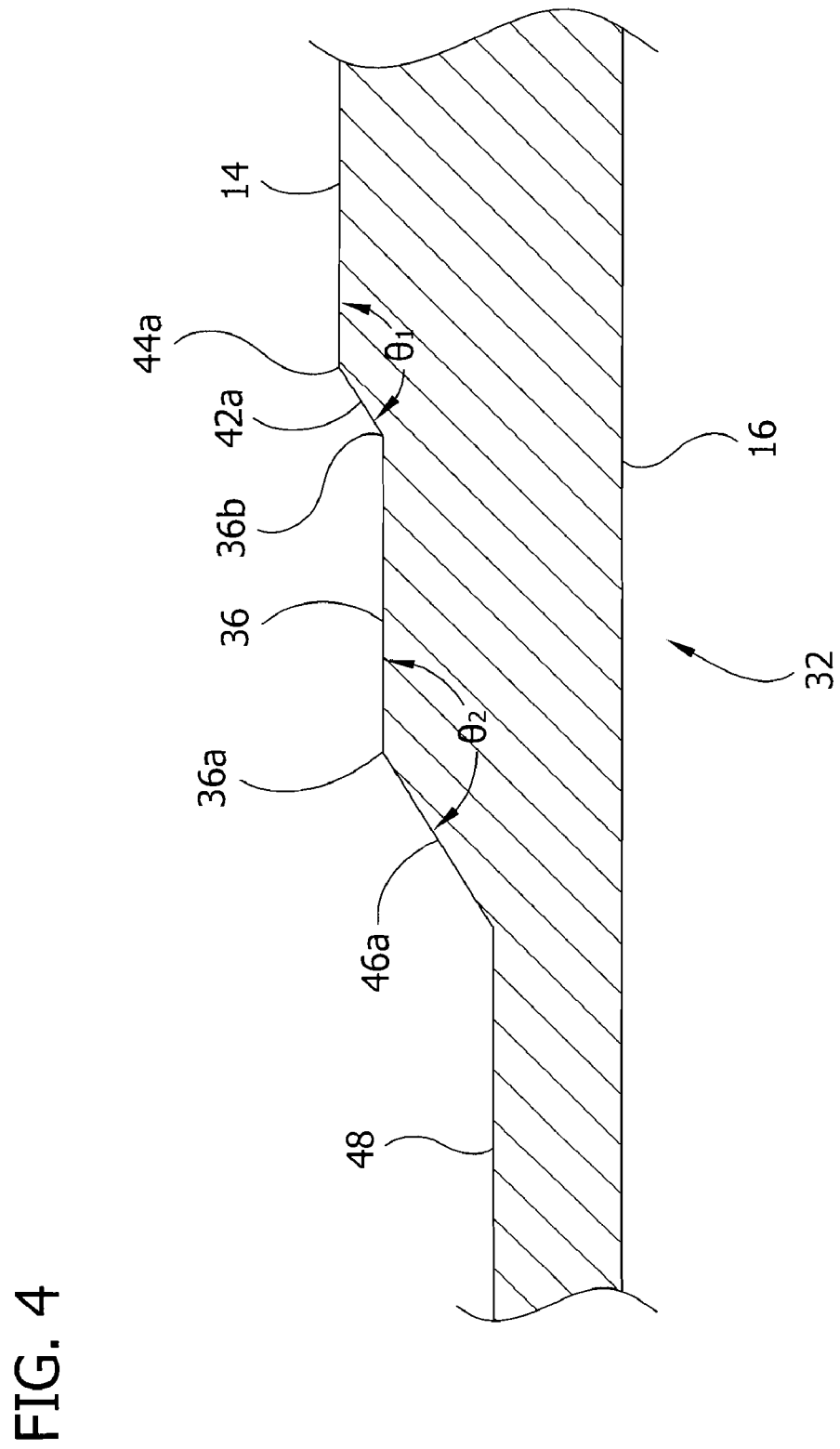
FIG. 4 is a section taken along the line 4-4 in FIG. 3.

Referring now to the drawings and in particular to FIGS. 1 and 2, a carrier blade for use in transferring a semiconductor wafer into and out of a wafer support rack of a deposition chamber is generally indicated at 10. The carrier blade 10 is secured to a robotic or other mechanical arm (not shown) during use. The carrier blade 10 generally includes a body 12 having a top surface 14 lying generally in a top plane and an opposite bottom surface 16 (FIG. 4). Referring to FIG. 2, a longitudinal axis A1 extends between a mounting end 20a and an opposite free end 20b of the body 12. The body 12 has a width W1 measured generally transverse to the longitudinal axis A1. Opposite lateral upper edges 22 extend along the length of the body 12 on either side of the longitudinal axis L1.

In general, the blade 10 includes a mounting region 24 and a support region 26, each being designated generally in the drawings. The mounting region 24 includes a plurality of mounting openings 28 extending through the top and bottom surfaces 14, 16, respectively, of the body 12. The mounting openings 28 are used to secure the blade 10 to the mechanical arm, such as a robotic arm, as is generally known in the art.

The support region 26 of the blade 10 extends from the mounting region 24 and may be formed integrally therewith. For example without being limiting, the blade 10, including mounting region 24 and the support region 26, may be machined from quartz stock or other material within the scope of the present invention. The support region 26 has a mounting end margin, generally indicated at 32, adjacent to the mounting region 24 and a free end margin, generally indicated at 34, adjacent to the free end 20b of the body 12. As shown best in FIG. 2, the width W1 of the blade 10 narrowingly tapers from the mounting end margin 32 of the support region 26 toward the free end margin 34 of the support region. The taper ends generally at the free end margin 34 of the support region 26 such that the width W1 of the blade 10 from the free end margin of the support region to the free end 20b of the blade 10 is generally constant. It is understood that other configurations of the blade 10 are within the scope of the present invention.

Figure 6:
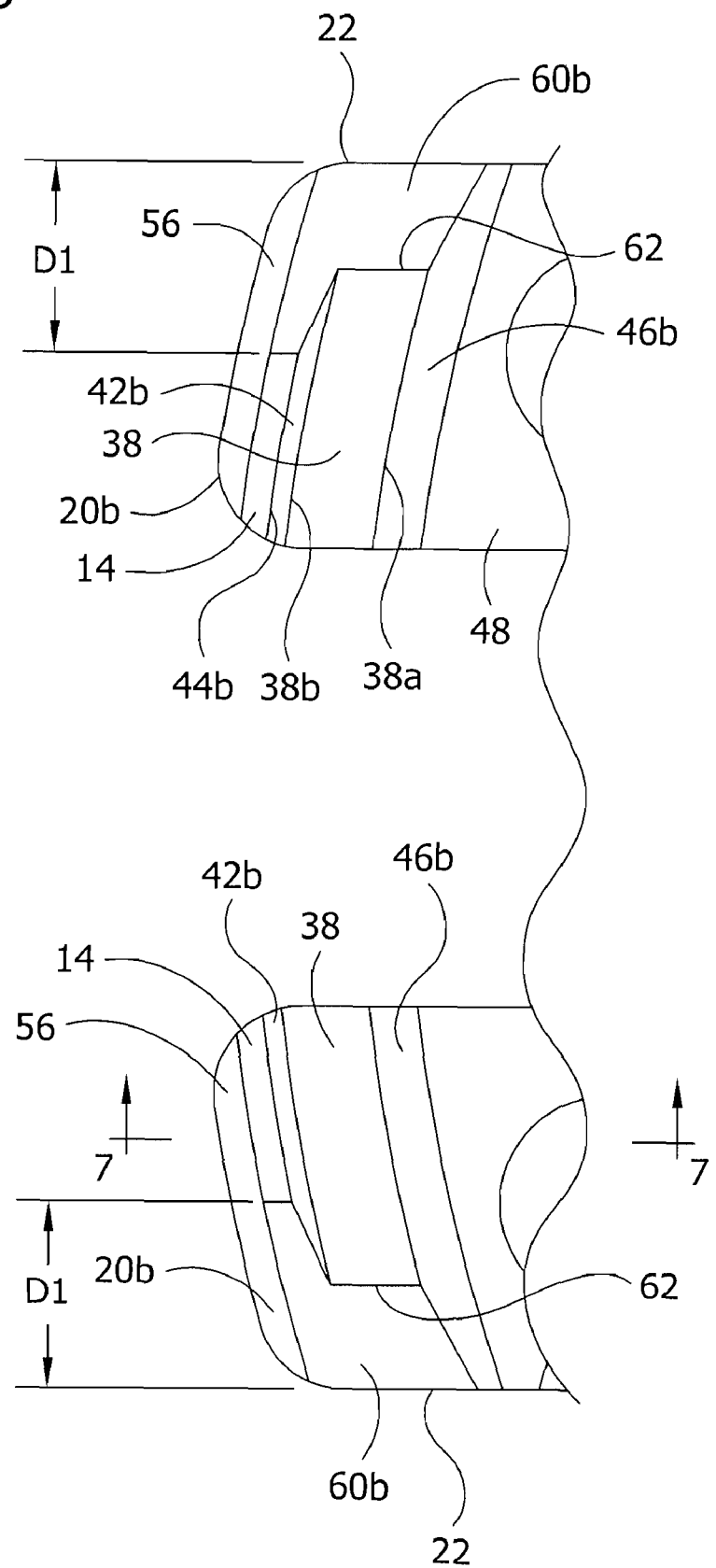
FIG. 6 is an enlarged, fragmentary view of the blade carrier of FIG. 2 detailing a free end margin of a support region of the blade carrier.
Figure 7:
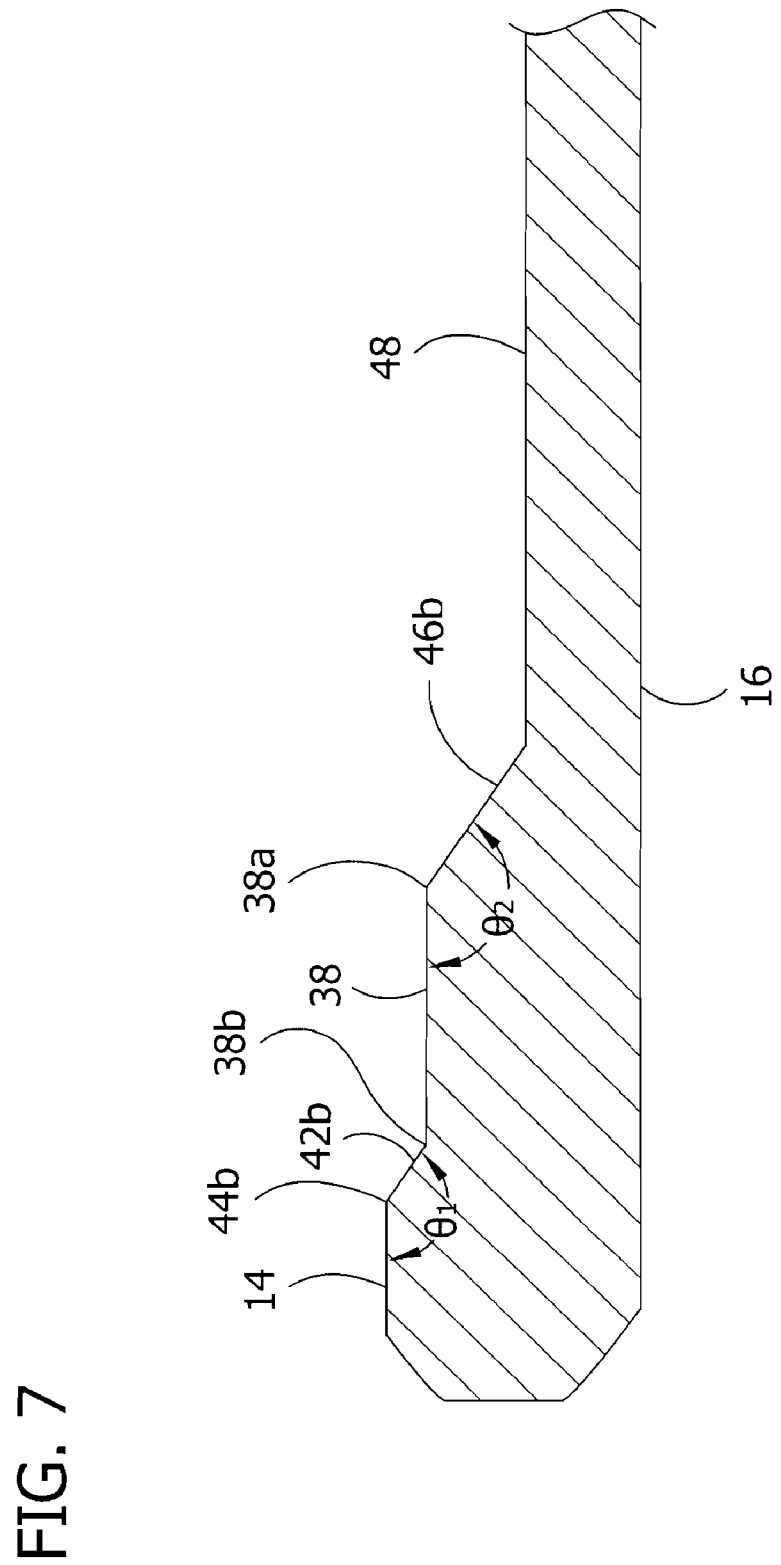
FIG. 7 is a section taken along the line 7-7 in FIG. 6.

Referring to FIGS. 1-4, 6 and 7, the support region 26 has a wafer engagement portion defined by opposite ledge surfaces 36, 38 for supporting the semiconductor wafer. As shown in FIGS. 4 and 7, the ledge surfaces 36, 38 are generally coplanar, lying in a support plane extending generally parallel to and below the top plane of the top surface 14 of the body 10. For example in one embodiment, the support plane may be from about 1.3 mm (about 0.051 in) to about 1.7 mm (about 0.067 in) below the top plane. As shown in FIGS. 1 and 2, the ledge surfaces 36, 38 are generally arcuate and extend partially around an imaginary center axis A2 of the support region 26 extending generally normal to the top plane. Each ledge surface 36, 38 has opposite inner and outer radial edges 36a, 36b and 38a, 38b, respectively, extending partially around the imaginary center axis A2; each outer radial edge 36b, 38b is situated radially outward from the respective inner radial edges 36a, 36b with respect to the imaginary center axis A2. The outer radial edges 36b, 38b have a common center of curvature at the imaginary center axis A2 and have equal, substantially constant radii of curvature. Similarly, the inner radial edges 36a, 38a of the ledge surfaces 36, 38 have a common center of curvature at the imaginary center axis A2 and have equal, constant radii of curvature.

Referring to FIG. 2, the outer radial edges 36b, 38b of the ledge surfaces 36, 38 define a maximum engagement radius $R1_{MAX}$ of the engagement portion of the support region 26, which is equal to the radii of curvature of the outer radial edges. Relatedly, the inner radial edges 36a, 38a of the ledge surfaces 36, 38 define a minimum engagement radius $R1_{MIN}$ of the engagement portion, which is equal to the radii of curvature of the inner radial edges. The maximum radius $R1_{MAX}$ of the engagement portion is at least as great as the radius of semiconductor wafer to be supported on the support region 26 of the blade 10. In one example, which is not limiting, the maximum radius $R1_{MAX}$ of the wafer engagement portion is slightly greater than the radius of the wafer to be supported. For example in one embodiment, for supporting a 300 mm wafer, the maximum radius $R1_{MAX}$ of the wafer engagement portion may measure from about 150.5 mm (about 5.925 in) to about 151.0 mm (about 5.945 in), and more preferably, about 150.8 mm (about 5.937 in). The minimum radius $R1_{MIN}$ of the engagement portion is less than the radius of the semiconductor wafer to be supported. The difference between the maximum engagement radius $R1_{MAX}$ and the minimum engagement radius $R1_{MIN}$ defines a width W2 of the engagement portion, which in one example given without limitation measures from about 3.0 mm (about 1.2 in) to about 4.0 mm (about 0.16 in).

Figure 3:
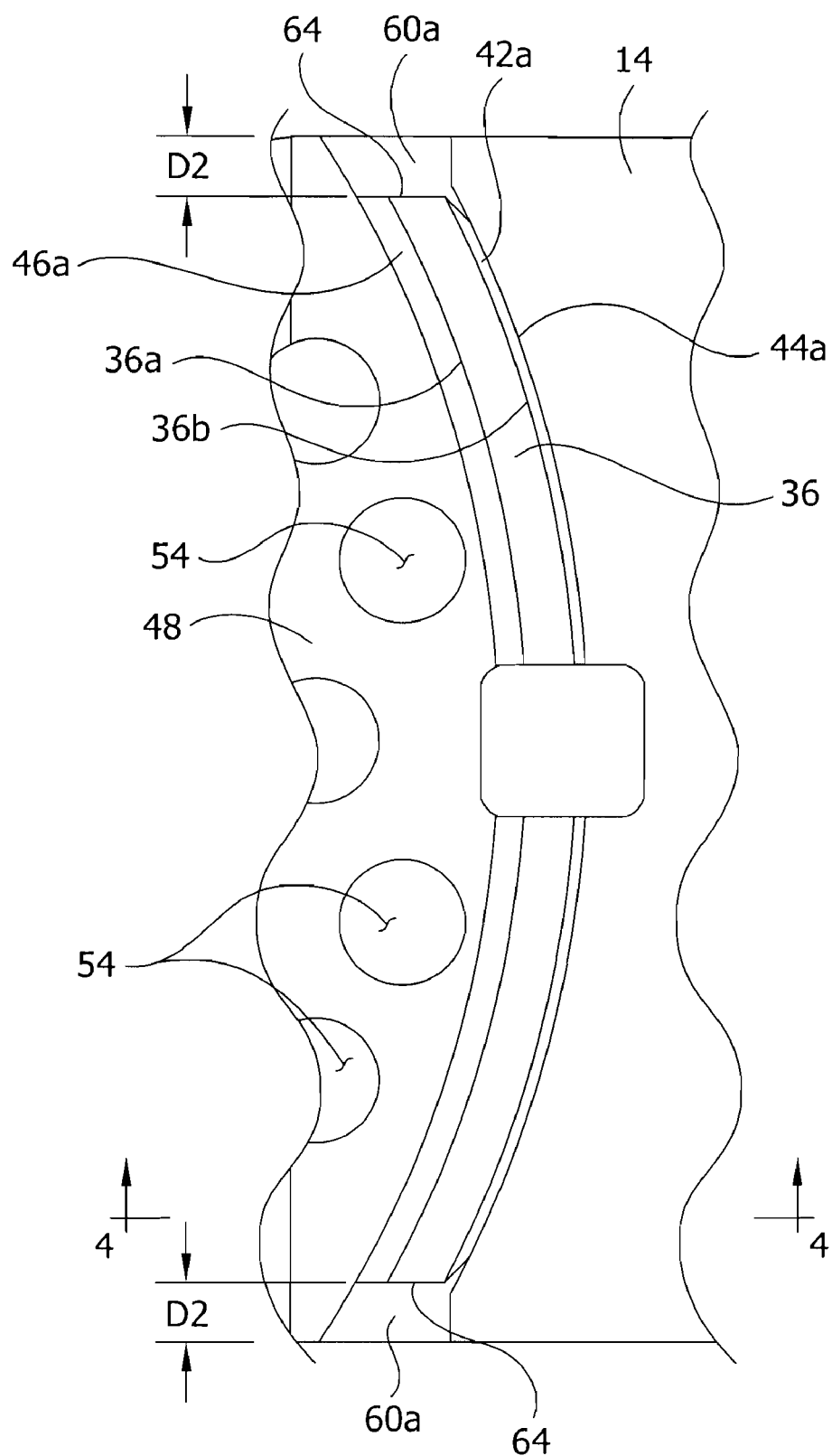
FIG. 3 is an enlarged, fragmentary view of the blade carrier of FIG. 2 detailing a mounting end margin of a support region of the blade carrier.

Referring to FIGS. 3 and 4, one upper transition surface 42a slopes downward from the top surface 14 toward the imaginary center axis A2 to the outer radial edge 36a of the ledge surface 36. Likewise, referring to FIGS. 6 and 7, another transition surface 42b of the support region 26 slopes downward from the top surface 14 of the body 12 toward the imaginary center axis A2 to the outer radial edge 38b of the ledge surface 38. The upper transition surfaces 42a, 42b, respectively, broadly constitute a first transition surface. Each upper transition surface 42a, 42b slopes downward from the top surface 14 at an angle $\theta_1$ (FIGS. 4 and 7) that is greater than 90 degrees. For example and without being limiting, the angles $\theta_1$ may measure from about 120 degrees to about 160 degrees, more particularly from about 140 degrees to about 150 degrees, and even more particularly, about 145 degrees. Arcuate edges 44a, 44b at the junctures of the upper transition surfaces 42a, 42b and the top surface 14 of the body 12 have equal, constant radii of curvature and share a center of curvature at the imaginary center axis A2 of the support region 26. These edges 44a, 44b may be considered descending edges because the upper transition surfaces 42a, 42b extend downward or descend from the edges. The edges 44a, 44b between the upper transition surfaces 42a, 42b and the top surface 14 of the body 12 define a maximum transition radius $R2_{MAX}$ (FIG. 2) that is greater than the maximum support radius $R1_{MAX}$.

Referring to FIGS. 3 and 4, one lower transition surface 46a extends downward from the inner edge 36a of the ledge surface 36 toward the imaginary center axis A2 to the lower surface 48. Likewise, referring to FIGS. 6 and 7, another lower transition surface 46b extends downward from the inner edge 38a of the ledge surface 38 toward the imaginary center axis A2 to a lower surface 48 of the support region 26. The inner edges 36a, 38a may be considered descending edges because the lower transition surfaces 46a, 46b extend downward or descend from respective edges. Together, the lower transition surfaces 46a, 46b broadly constitute a second transition surface. Each lower transition surface 46a, 46b slopes downward from its respective ledge surface 36, 38 at an angle $\Theta_2$ (FIGS. 4 and 7) that is obtuse. For example and without being limiting, the angles $\Theta_2$ may measure from about 120 degrees to about 160 degrees, more particularly from about 140degrees to about 150 degrees, and even more particularly, about 145 degrees. Accordingly, the inner radial edges 36a, 38a of the ledge surfaces 36, 38, respectively, are not sharp because the lower transition surfaces 46a, 46b do not slope downward or descend from the ledge surfaces 36, 38 at angles $\Theta_2$ that are equal to or less than 90 degrees. The applicants have discovered that by making the inner radial edges 36a, 38a blunt (i.e., not sharp), the edges are less likely to scratch or otherwise damage a wafer that is being supported by the engagement surface of the support region 24 during use.

The lower surface 48 of the support region 26 extends along the longitudinal axis A1 of the body 12 between the mounting and free end margins 32, 34 of the support region 26. Opposite lateral side margins 52 (FIGS. 1 and 2) of the lower surface 48 slope downward toward the corresponding upper lateral edges 22 of the body 12. A plurality of openings 54 are formed in the lower surface 48 of the support region 26. As is generally known in the art, the openings 54 lower the quartz mass and allow faster heating and cooling of the blade.

Referring to FIGS. 6 and 7, an axial bevel 56 is formed at a margin of the free end 20b of the blade 10. The axial bevel 56 extends generally longitudinally from the top surface 14 at the free end margin to the free end 20b of the blade 10. As is generally known in the art, this axial bevel 56 minimizes blade chipping.

An axial cutout 58 extending through the free end 20b of the body 12 splits the free end margin 34 of the support region 26 into two lateral segments. As a result, the free end margin 34 of the support region 26, including the ledge surface 38 and the corresponding upper and lower transition surfaces 42a, 46a, is discontinuous.

Figure 8:
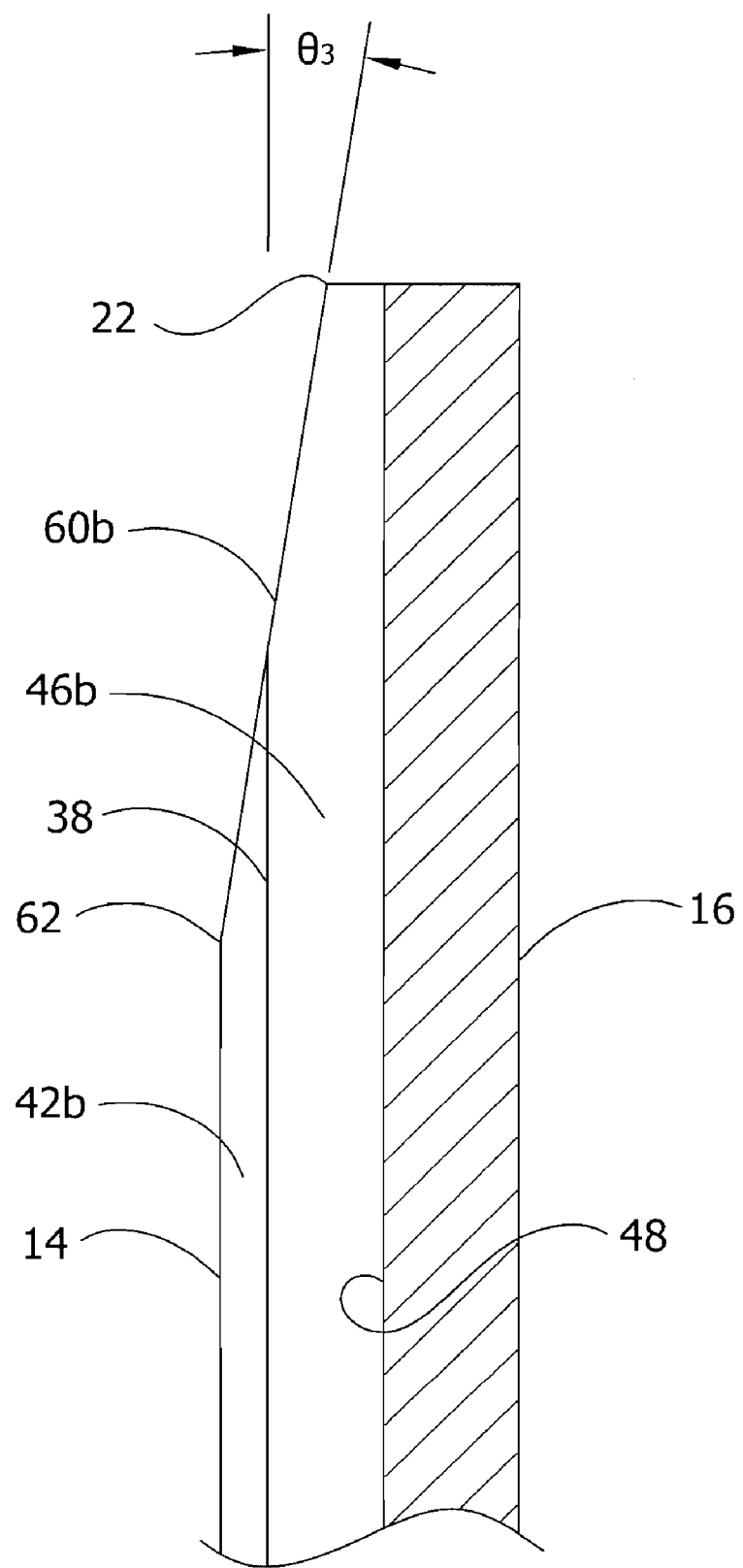
FIG. 8 is a section taken along the line 8-8 in FIG. 2.

Referring to FIGS. 1-3, 5, 6 and 8, bevels 60a, 60b are formed at the respective free and mounting end margins 32, 34, respectively, of the support region 26. As shown in FIGS. 6 and 8, the bevels 60b consist of a pair of bevels positioned on either side of the longitudinal axis A1 generally adjacent to the corresponding upper lateral edge 22. In the illustrated embodiment, the bevels 60b begin at the top surface 14 of the body 12 at locations spaced inward from the respective upper lateral edges 22 with respect to the longitudinal axis A1 by perpendicular distances D1, each measuring from about 12 mm (about 0.47 in) to about 16 mm (about 0.63 in), and more particularly about 14 mm (about 0.55 in). From this inward location at the top surface 14, each bevel 60b extends downward to the respective adjacent upper lateral edge 22 of the body so that each bevel cuts through the upper transition surface 42b, the ledge surface 38 and the lower transition surface 46b at the free end margin 34. The bevels 60b intersect the ledge surface 38 at lateral edges 62 of the ledge surface. The lateral edges 62 may be considered descending edges because the bevels slope downward from respective edges. Each bevel 60b extends downward to the respective adjacent lateral upper edge 22 at a bevel angle $\theta_3$ (FIG. 8). In one embodiment, the angle $\theta_3$ measures from about 1 degree to about 15 degrees with respect to the plane in which the ledge surfaces 36, 38 lie, which means the bevels extend downward from the ledge surfaces at angles measuring from about 179 degrees to about 165 degrees. In one example given without being limiting, the angle $\theta_3$ measures about 9 degrees with respect to the plane in which the ledge surfaces 36, 38 lie, which means the bevels extend downward from the ledge surfaces at angles measuring about 171 degrees. Accordingly, the angles at which the bevels extend downward from the ledge surfaces are obtuse, and as a result, the lateral edges 64 of the ledge surface 36 are blunt (i.e., not sharp). The blunt lateral edges 64 reduce or eliminate back side scratching of the wafer being supported.

In the illustrated embodiment and as shown in FIG. 6, each bevel 60b also extends laterally outward with respect to the longitudinal axis A1 toward the corresponding upper lateral edge 22 at an angle that is less than 90 degrees with respect to the longitudinal axis so that each bevel 60b generally follows the arc or curvature of the free end margin 34 of the support region 26. It is understood that the bevels 60b may extend at other angles, including generally perpendicularly, with respect to the longitudinal axis A1.

Figure 5:
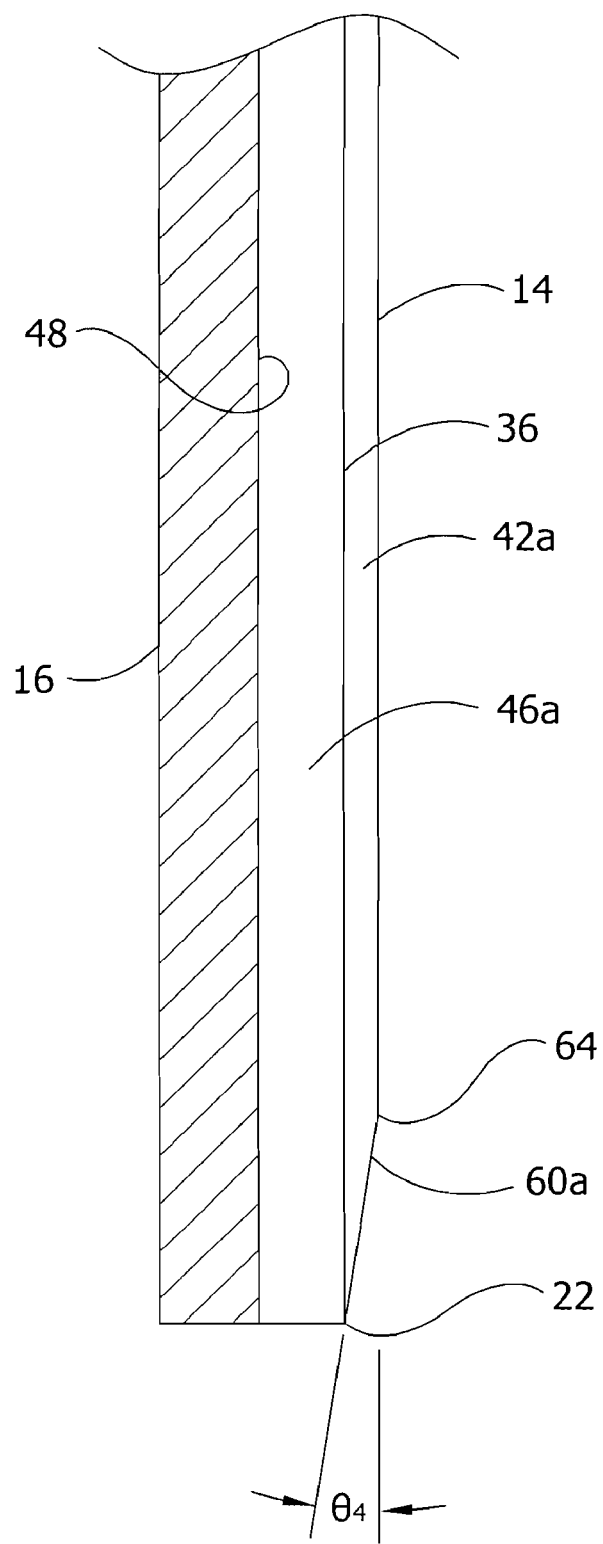
FIG. 5 is a section taken along the line 5-5 in FIG. 2.

Referring to FIGS. 3 and 5, the bevels 60a consist of a pair of bevels positioned on either side of the longitudinal axis A1 at the mounting end margin 32 of the support region 26. In the illustrated embodiment, the bevels 60a begin at the top surface 14 of the body 12 at locations spaced inward from the respective upper lateral edges 22 with respect to the longitudinal axis A1 by perpendicular distances D2. In one embodiment, each perpendicular distance D2 measures from about 7 mm (about 0.3 in) to about 9 mm (about 0.4 in). In the illustrated embodiment, the perpendicular distance D2 is about 8 mm (about 0.3 in). From this inward location at the top surface 14, the bevels 60a extend downward to the respective adjacent upper lateral edge 22 of the body so that each bevel cuts through the upper transition surface 42a, the ledge surface 36 and the lower transition surface 46a at the mounting end margin 32. The bevels 60a intersect the ledge surface 36 at lateral edges 64 of the ledge surface. The lateral edges 64 may be considered descending edges because the bevels 60a slope downward from respective edges. In one embodiment, the bevels 60a extend downward to the respective adjacent lateral upper edges 22 at bevel angles $\theta_4$ of between about 1 degree and about 15 degrees with respect to the plane in which the ledge surfaces 36, 38 lie, which means the bevels extend downward from the ledge surfaces at angles measuring from about 179 degrees to about 165 degrees. In one example given without limitation, the angle $\theta_4$ measures about 9 degrees with respect to the plane in which the ledge surfaces 36, 38 lie, which means the bevels extend downward from the ledge surfaces at angles measuring about 171 degrees. Accordingly, the angles at which the bevels extend downward from the ledge surfaces are obtuse, and as a result, the lateral edges 64 of the ledge surface 36 are blunt (i.e., not sharp). The blunt lateral edges 64 reduce or eliminate back side scratching of the wafer being supported.

In the illustrated embodiment, the bevels 60a extend laterally outward with respect to the longitudinal axis A1 toward the respective adjacent upper lateral edges 22 at generally perpendicular angles with respect to the longitudinal axis. It is understood that the angles may be other than perpendicular and be within the scope of the present invention. For example and without being limiting, the angles may be such that each bevel 60a generally follows the arc or curvature of the mounting end margin 32 of the support region 26, similar to the bevels 60b in the illustrated embodiment. Other configurations are envisioned as being within the scope of the present invention.

As can be understood from the above discussion, the blade 10 of the present invention reduces back side scratches and damage to a wafer being supported on the blade 10 because blade is free from "sharp" edges that contact the wafer as the wafer is being supported by the blade. As explained above, the wafer is supported on the engagement surface of the blade 10, which comprises the ledge surfaces 36, 38, respectively. As also explained above, the upper lateral edges 22 and the inner edges 36a, 38a of the respective ledge surfaces 36, 38 are not "sharp" edges because of the sloping bevels 60a, 60b and the sloping lower transition surfaces 46a, 46b. The applicants have discovered that supporting the wafer in such a way that the back side of the wafer does not contact any sharp edges greatly reduces back side damage to the wafer.

Having described the invention in detail, it will be apparent that modifications and variations are possible without departing from the scope of the invention defined in the appended claims.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above constructions, products, and methods without departing from the scope of the invention, it is intended that all matter contained in the above description and shown in the accompanying drawings shall be interpreted as illustrative and not in a limiting sense.

What is claimed is:

1. A carrier blade for transferring a semiconductor wafer into and out of a deposition chamber and having top and bottom surfaces and a longitudinal axis extending between opposite mounting and free ends, the carrier blade comprising:
   a support region for supporting a semiconductor wafer, said support region having mounting and free end margins spaced from one another along the longitudinal axis and a lower surface extending between the mounting and free end margins;
   an engagement portion at the support region including a ledge surface at each of the mounting and free end margins of the support region for engaging and supporting the wafer, the ledge surfaces lying generally in a support plane disposed below the top surface of the blade;
   transition surfaces sloping downward from the ledge surfaces toward the lower surface of the support region, each of the transition surfaces sloping downward from the corresponding ledge surface at an angle measuring greater than 90 degrees.

2. A carrier blade as set forth in claim 1 wherein each of the angles at which the transition surfaces slope downward from the corresponding ledge surfaces measures from about 120 degrees to about 160 degrees.

3. A carrier blade as set forth in claim 2 wherein each of the angles at which the transition surfaces slope downward from the corresponding ledge surfaces measures from about 140 degrees to about 150 degrees.

4. A carrier blade as set forth in claim 3 wherein each of the angles at which the transition surfaces slope downward from the corresponding ledge surfaces measures about 145 degrees.

5. A carrier blade as set forth in claim 1 wherein the ledge surfaces are generally arcuate and extend partially around an imaginary center axis of the support region extending generally normal to the top plane.

6. A carrier blade as set forth in claim 5 wherein the ledge surfaces have outer radial edges with respect to the imaginary center axis together defining a maximum engagement radius of the engagement portion of the support region having a radius of curvature greater than 150.5 mm.

7. A carrier blade as set forth in claim 6 wherein the maximum engagement radius of the engagement portion of the support region has a radius of curvature from about 150.5 mm to about 151.0 mm.

8. A carrier blade as set forth in claim 6 further comprising second transition surfaces sloping downward from an upper surface of the carrier blade to the corresponding ledge surfaces at angles that measure greater than 90 degrees.

9. A carrier blade as set forth in claim 1 wherein the carrier blade has opposite upper lateral edges on either side of the longitudinal axis, said carrier blade further comprising a pair of bevels positioned on opposite sides of the longitudinal axis at one of the free end margin and the mounting end margin of the support region, each bevel extending from a location spaced inward from a corresponding upper lateral edge to the corresponding upper lateral edge.

10. A carrier blade as set forth in claim 1 wherein the free end margin of the support region is split so that the corresponding ledge surface is discontinuous.

11. A carrier blade as set forth in claim 1 wherein a plurality of openings is formed in the lower surface of the support region.

12. A carrier blade as set forth in claim 1 further comprising a mount connected to the support region for securing the blade carrier to a mechanical arm.

13. A carrier blade as set forth in claim 1 wherein a width of the carrier blade at the support region tapers toward the free end margin of the support region.

14. A carrier blade for transferring a semiconductor wafer into and out of a support rack and having top and bottom surfaces, a longitudinal axis extending between opposite mounting and free ends of the body, and an upper lateral edge on either side of the longitudinal axis extending along a length of the blade, the carrier blade comprising:
   a support region for supporting a semiconductor wafer, said support region having mounting and free end margins spaced from one another along the longitudinal axis of the carrier blade and a lower surface extending between the mounting and free end margins;
   an engagement portion at the support region including ledge surfaces at the respective mounting and free end margins of the support region for engaging and supporting the wafer, the ledge surfaces lying generally in a support plane positioned below the top surface of the carrier blade;
   a first pair of bevels at the free end margin of the support region, each bevel being disposed on opposite sides of the longitudinal axis and extending from the corresponding ledge surface of the free end margin to the corresponding one of the upper lateral edges of the carrier blade;
   a second pair of bevels at the mounting end margin of the support region, each bevel of said second pair of bevels extending from the ledge surface at the mounting end margin to the corresponding one of the upper lateral edges of the body.

15. A carrier blade as set forth in claim 14 wherein each bevel of the first pair of bevels extends at an angle that measures from about 179 degrees to about 165 degrees with respect to the respective ledge surface.

16. A carrier blade as set forth in claim 14 wherein each bevel of the first pair of bevels extends at an angle that measures from about 175 degrees to about 170 degrees with respect to the respective ledge surface.

17. A carrier blade as set forth in claim 14 wherein each bevel of the first pair of bevels extends at an angle that measures about 171 degrees with respect to the respective ledge surface.

18. A carrier blade as set forth in claim 14 wherein the ledge surface at the free end margin extends generally around an imaginary center axis of the support region between the mounting and free end margins of the support region, wherein each bevel of the first pair of bevels extends to the respective upper lateral edge at an angle with respect to the longitudinal axis that is greater than 90 degrees so that the bevel generally follows the curvature of the ledge surface.

19. A carrier blade as set forth in claim 14 wherein each bevel of the first pair of bevels extends from the top surface of the carrier blade to the respective upper lateral edge.

20. A carrier blade as set forth in claim 19 wherein each bevel of the first pair of bevels extends from the top surface at an inward location having a perpendicular distance with respect to the upper lateral edge measuring from about 12 mm and about 14 mm.

21. A carrier blade as set forth in claim 14 wherein each bevel of said second pair of bevels extends at an angle that measures between about 179 degrees and about 165 degrees with respect to the ledge surface at the mounting end margin of the support region.

* * * * *